(12) United States Patent
Kim et al.

(10) Patent No.: US 7,590,900 B2
(45) Date of Patent: Sep. 15, 2009

(54) FLIP FLOP CIRCUIT & SAME WITH SCAN FUNCTION

(75) Inventors: Chung-hee Kim, Suwon-si (KR); Min-su Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/239,323

(22) Filed: Sep. 30, 2005

(65) Prior Publication Data

US 2006/0085709 A1    Apr. 20, 2006

(30) Foreign Application Priority Data

Oct. 2, 2004    (KR) .................. 10-2004-0078548

(51) Int. Cl.
G01R 31/28    (2006.01)
G11C 29/00    (2006.01)

(52) U.S. Cl. ................ 714/724; 365/201
(58) Field of Classification Search ............ None
See application file for complete search history.

(56) References Cited

U.S. PATENT DOCUMENTS

| | | | |
|---|---|---|---|
| 5,426,380 A | 6/1995 | Rogers | |
| 5,742,192 A | 4/1998 | Banik | |
| 5,774,473 A | 6/1998 | Harley | |
| 5,805,608 A * | 9/1998 | Baeg et al. ................. | 714/726 |
| 5,812,562 A * | 9/1998 | Baeg ........................ | 714/726 |
| 5,896,341 A * | 4/1999 | Takahashi ............... | 365/230.06 |
| 5,953,284 A | 9/1999 | Baker et al. | |
| 5,999,030 A | 12/1999 | Inoue | |
| 6,061,293 A | 5/2000 | Miller | |
| 6,246,614 B1 * | 6/2001 | Ooishi ...................... | 365/191 |
| 6,326,829 B1 | 12/2001 | Naffziger | |
| 6,389,566 B1 * | 5/2002 | Wagner et al. .............. | 714/726 |
| 6,608,513 B2 | 8/2003 | Tschanz et al. | |
| 6,614,276 B2 | 9/2003 | Robertson et al. | |
| 6,658,632 B1 * | 12/2003 | Parulkar et al. ................. | 716/4 |
| 6,742,151 B2 * | 5/2004 | Park et al. ................... | 714/729 |

(Continued)

FOREIGN PATENT DOCUMENTS

GB    2408641    1/2005

(Continued)

OTHER PUBLICATIONS

Korean Patent Office Action dated Feb. 28, 2006 (with English translation).

(Continued)

*Primary Examiner*—Cynthia Britt
*Assistant Examiner*—Guerrier Merant
(74) *Attorney, Agent, or Firm*—Harness, Dickey & Pierce, P.L.C.

(57) ABSTRACT

A pulse-based flip flop, which outputs a scan input signal and a data signal, may include: a pulse generator to generate a pulse signal for coordinating operation of the flip flop; a multiplexer to receive the data signal, the scan input signal, and a scan enable signal, and to selectively output one of the data signal and the scan input signal in response to the scan enable signal; and a latch unit to transfer therethrough a signal received from the multiplexer according to the pulse signal.

26 Claims, 11 Drawing Sheets

U.S. PATENT DOCUMENTS

| | | | |
|---|---|---|---|
| 6,911,845 B2 * | 6/2005 | Hossain et al. | 326/93 |
| 6,938,225 B2 * | 8/2005 | Kundu | 716/1 |
| 6,972,592 B2 * | 12/2005 | Benware | 326/38 |
| 6,982,923 B2 * | 1/2006 | Ootsuki | 365/233 |
| 2001/0021953 A1 * | 9/2001 | Nakashima | 710/5 |
| 2002/0087930 A1 | 7/2002 | Kanba | |
| 2002/0143515 A1 * | 10/2002 | Nadeau-Dostie et al. | 703/19 |
| 2003/0093734 A1 * | 5/2003 | Zhang et al. | 714/731 |
| 2004/0041610 A1 * | 3/2004 | Kundu | 327/215 |
| 2004/0075479 A1 * | 4/2004 | Gupta | 327/202 |
| 2004/0078741 A1 | 4/2004 | Morton | |
| 2004/0100856 A1 * | 5/2004 | Ootsuki | 365/233 |
| 2004/0145937 A1 | 7/2004 | Kinoshita | |
| 2004/0193981 A1 * | 9/2004 | Clark et al. | 714/726 |
| 2004/0196067 A1 | 10/2004 | Hossain | |
| 2005/0015651 A1 * | 1/2005 | Schultz et al. | 714/5 |
| 2005/0047247 A1 * | 3/2005 | Hatakeyama et al. | 365/222 |
| 2005/0104133 A1 | 5/2005 | Kanno | |
| 2005/0138511 A1 * | 6/2005 | Benware | 714/727 |
| 2005/0248383 A1 * | 11/2005 | Fang et al. | 327/407 |
| 2005/0268191 A1 * | 12/2005 | Shin | 714/726 |
| 2006/0026473 A1 * | 2/2006 | Patrick Tan | 714/26 |
| 2006/0056237 A1 * | 3/2006 | Jeong | 365/185.01 |

FOREIGN PATENT DOCUMENTS

| | | |
|---|---|---|
| GB | 2408641 A | 1/2005 |
| JP | 10-160804 | 6/1998 |
| JP | 2000-227456 | 8/2000 |
| JP | 2001-324544 | 11/2001 |
| KR | 10-0257208 | 5/2000 |
| TW | 452682 | 9/2001 |

OTHER PUBLICATIONS

United Kingdom Patent Office Action dated Dec. 2, 2005 for Application No. GB0519988.0.

Search Report dated Apr. 10, 2008 for corresponding U.K. Appl. No. GB0519988.0.

First Office Action issued by Taiwan Intellectual Property Office on May 15, 2008 for corresponding Taiwanese application, with English translation.

Preliminary Notice of First Office Action issued by Taiwan Intellectual Property Office on Sep. 26, 2008 for corresponding Taiwanese application, with English translation.

U.K. Intellectual Property Office report dated Dec. 10, 2008 for counterpart U.K. application.

Preliminary Notice of First Office Action issued by Taiwan Intellectual Property Office on Apr. 6, 2009 for corresponding Taiwanese application, with English translation.

* cited by examiner

FLIP FLOP CIRCUIT & SAME WITH SCAN FUNCTION

PRIORITY STATEMENT

This application claims the benefit of Korean Patent Application No. 10-2004-0078548, filed on Oct. 2, 2004, in the Korean Intellectual Property Office, the disclosure of which is incorporated herein in its entirety by reference.

BACKGROUND

A DFT (Device for Testability) technique for testing semiconductor chips has been widely used to determine the quality of a chip. Also, a scan test technique has been conventionally used as an important technique in chip testing.

In general, a flip flop circuit stores and sequentially transfers a received signal in response to a clock signal or a pulse signal. A flip flop circuit with a scan function receives a scan test signal and tests a logic circuit in a corresponding semiconductor circuit using the scan test signal. Accordingly, such a flip flop circuit with a scan function is designed according to the needs of the test to be performed upon a logic circuit.

Meanwhile, the DFT is a chip test device using scan cells and is used when an internal scan chain is formed in order to reduce a time for testing of a semiconductor chip. Conventionally, a scan cell method and a BIST (Built-in-Test) method are mainly used with a DFT. Here, the scan cell method is performed to make the testing of a chip more robust by forming flip flops using a series of shift registers. Test data is applied to the flip flops or measuring values stored in the flip flops through a shift path (that is, scan path) when testing the chip.

FIG. 1 is a circuit diagram of a conventional master-slave flip flop 100.

Referring to FIG. 1, the conventional master-slave flip flop 100 with a scan function includes a first AND gate 102 which receives a data signal D and an inverted scan enable signal ~SE and performs an AND operation of the data signal D and the inverted scan enable signal ~SE; a second AND gate 104 which receives a scan input signal SI and a scan enable signal SE and performs an AND operation of the scan input signal SI and the scan enable signal SE; a first NOR gate 106 which performs a NOR operation of an output of the first AND gate 102 and an output of the second AND gate 104; a first tri-state inverter 108 which inverts an output of the first NOR gate 106 when an inverted clock signal CKB is logic high; a first inverter 110 which inverts an output of the first tri-state inverter 108; a second tri-state inverter 112 which inverts an output of the first inverter 110 and transfers the inverted output to an input terminal of the first inverter 110 when a clock signal CK is logic high; a second inverter which inverts an output of the tri-state inverter 114; a third tri-state inverter 114 which inverts an output of the first inverter 110 when the inverted clock signal CKB is logic high; a second inverter 116 which inverts an output of the third tri-state inverter 114; a fourth tri-state inverter 118 which inverts an output of the second inverter 116 and transfers the inverted output to an input terminal of the second inverter 116 when the clock signal CK is logic high; and a third inverter 120 which inverts and amplifies an output of the inverter 116.

If the scan enable signal SE is logic low, the data signal D is output through the first AND gate 102 and the NOR gate 106. If the clock signal CK is logic low, the data signal D is transferred to a first latch unit 122 including the inverters 110 and 112. If the clock signal CK is logic high, the first tri-state inverter 108 is turned off and the data signal D is stored in the first latch unit 122. Then, the third tri-state inverter 114 inverts the data signal D stored in the first latch unit 122 and transfers the inverted data signal to a second latch unit 124 including the inverters 116 and 118, in synchronization to the clock signal CK of logic low. The data stored in the second latch unit 124 is transferred to a logic circuit of a semiconductor chip via the third inverter 120. The second latch unit 124 maintains the stored data until the stored data is synchronized to a following clock signal.

However, the conventional master-slave flip flop 100 shown in FIG. 1 is not suitable for high-speed operation since a D-to-Q delay (delay time between an input and an output) is long.

Compared with such a clock-based master-slave flip flop, in a pulse-based flip flop, since a D-to-Q delay is short, it is possible to reduce loading, a C-to-Q delay (delay time between a clock transition and an output) as well as the D-to-Q delay, and to achieve size reduction of the flip flop.

However, since a conventional pulse-based flip flop with a scan function has a complicated circuit configuration, it requires a large area.

SUMMARY

One or more embodiments of the present invention can provide a pulse-based flip flop with a scan function capable of minimizing a signal transmission path.

One or more embodiments of the present invention also provide a pulse-based flip flop with a scan function, having a small size.

An embodiment of the present invention provides a pulse-based flip flop which outputs a scan input signal and a data signal. Such a flip flop may include: a pulse generator to generate a pulse signal for coordinating operation of the flip flop; a multiplexer to receive the data signal, the scan input signal, and a scan enable signal, and to selectively output one of the data signal and the scan input signal in response to the scan enable signal; and a latch unit to transfer therethrough a signal received from the multiplexer according to the pulse signal.

Additional features and advantages of the invention will be more fully apparent from the following detailed description of the example embodiments, the accompanying drawings and the associated claims.

BRIEF DESCRIPTION OF THE DRAWINGS

The accompanying drawings are intended to depict example embodiments of the present invention and should not be interpreted to limit the scope thereof. The accompanying drawings are not to be considered as drawn to scale unless explicitly noted.

DETAILED DESCRIPTION OF EXAMPLE EMBODIMENTS

Hereinafter, embodiments of the present invention will be described in detail with reference to the appended drawings. Like reference numbers refer to like components throughout the drawings.

Figure 1:
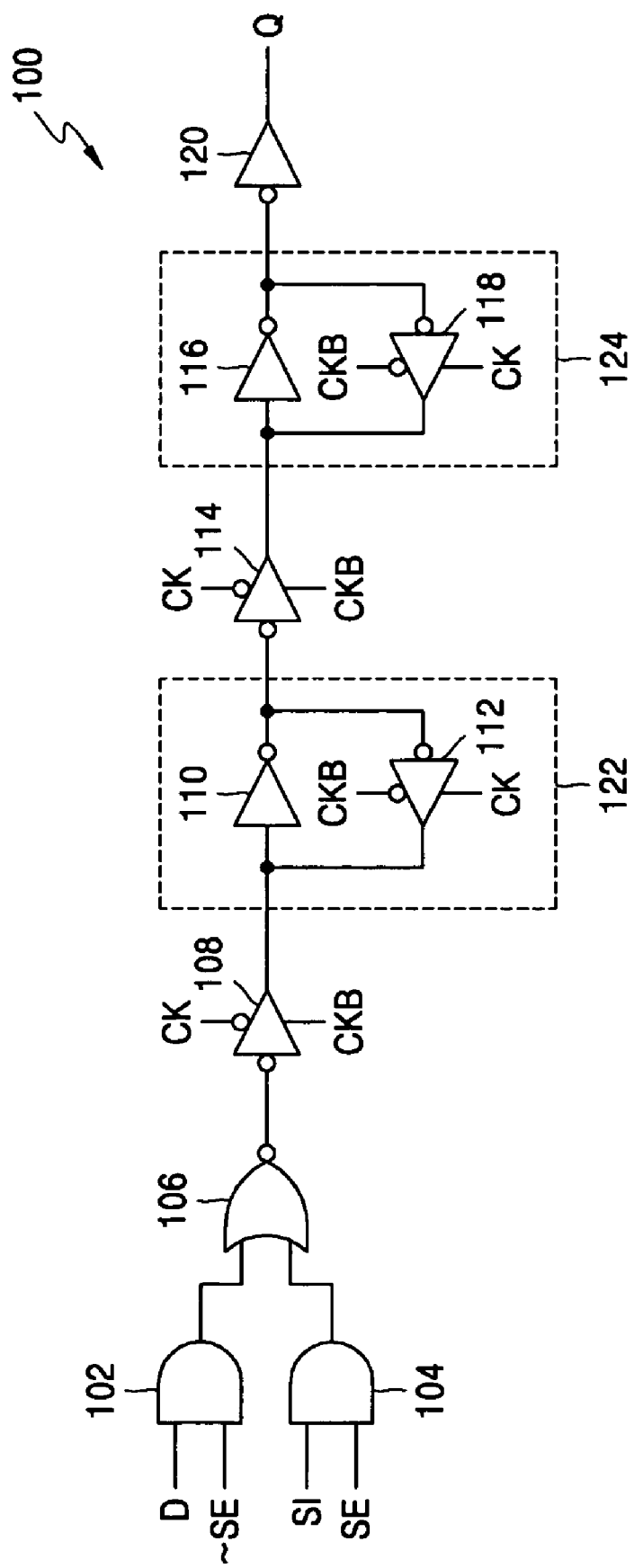
FIG. 1 is a circuit diagram of a conventional master-slave flip flop.
Figure 2:
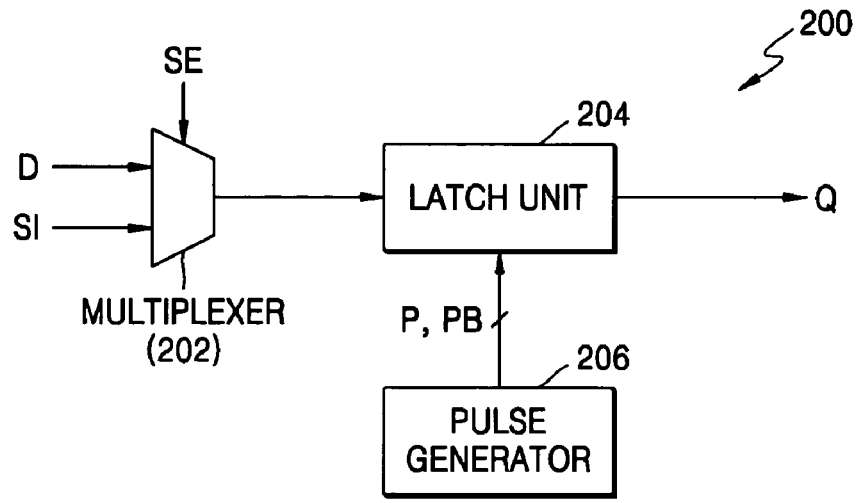
FIG. 2 is a block diagram of a pulse-based flip flop with a scan function according to an embodiment of the present invention.

FIG. 2 is a block diagram of a pulse-based flip flop 200 with a scan function according to an embodiment of the present invention.

Referring to FIG. 2, the pulse-based flip-flip 200 includes a multiplexer 202, a latch unit 204, and a pulse generator 206. The multiplexer 204 receives a data signal D, a scan input signal SI, and a scan enable signal SE.

The data signal D is provided when a semiconductor chip operates normally and the scan input signal SI is provided to the input of the flip flop 200 when the semiconductor chip is tested. The scan enable signal SE is a signal for commanding the flip flop 200 to output the scan input signal SI. That is, if the scan enable signal SE is logic low, the flip flop 200 transmits the data signal D. On the contrary, if the scan enable signal SE is logic high, the flip flop 200 transmits the scan input signal SI.

The multiplexer 202 selectively outputs one of the scan input signal SI and the data signal D in response to the scan enable signal SE. The latch unit 204 maintains the data signal D or the scan input signal SI output from the multiplexer 202, and transmits the signal to the outside, according to a pulse signal generated by the pulse generator 206. The pulse generator 206 generates a pulse signal for coordinating the operation of the flip flop 200.

The flip flop 200 shown in FIG. 2 can selectively transmit one of a scan input signal and a data signal, using the multiplexer 202 disposed before the latch unit 204. Also, a time in which a signal received from the multiplexer 202 to the latch unit 204 according to a pulse signal generated by the pulse generator 206 is output from the latch unit 204, is relatively shorter, thereby reducing a D-to-Q delay.

Figure 3:
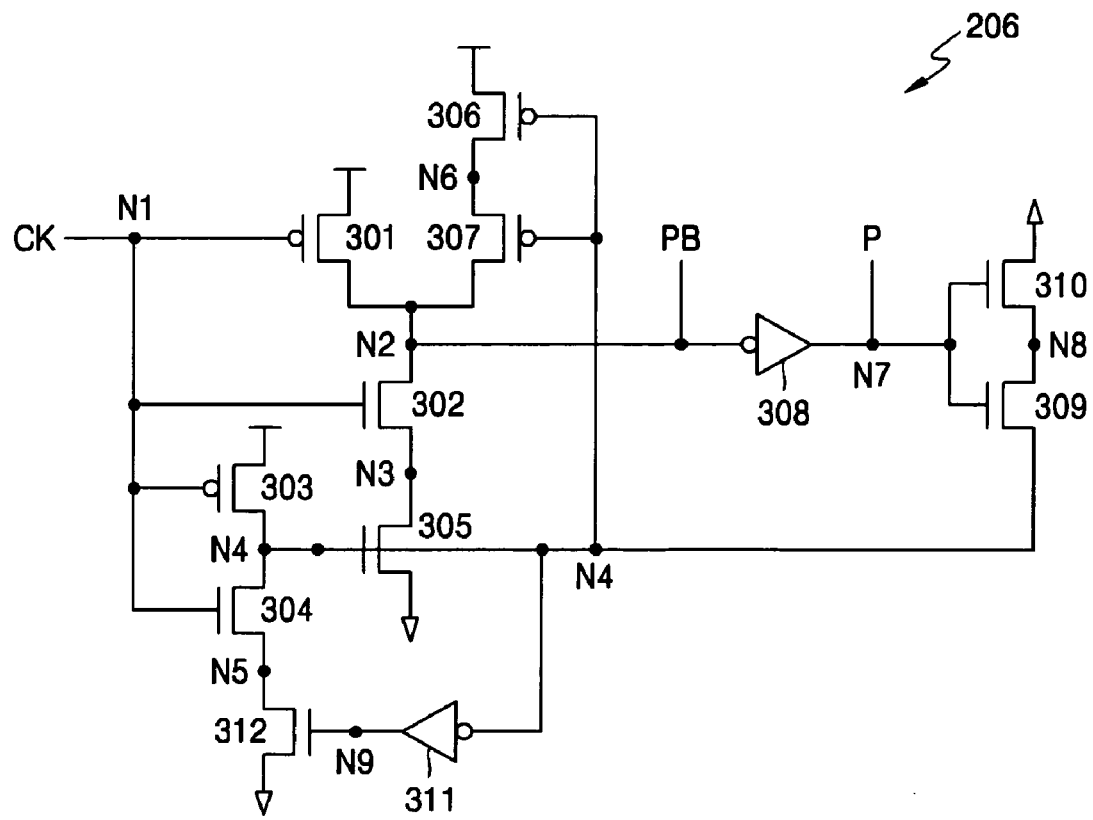
FIG. 3 is a circuit diagram of a pulse generator shown in FIG. 2, according to an embodiment of the present invention.

FIG. 3 is a circuit diagram of the pulse generator 206 shown in FIG. 2, according to an embodiment of the present invention.

A pulse generator 206 shown in FIG. 3 can include: a first PMOS transistor 301 which connects a second node N2 to a supply voltage in response to a voltage of a first node N1 to which a clock signal is input; a first NMOS transistor 302 which connects the second node N2 with a third node N3 in response to the voltage of the first node N1; a second PMOS transistor 303 which connects a fourth node N4 to the supply voltage in response to the voltage of the first node N1; a second NMOS transistor 304 which connects the fourth node N4 with a fifth node N5 in response to the voltage of the first node N1; a third NMOS transistor 305 which connects the third node N3 to a ground voltage in response to a voltage of the fourth node N4; a third PMOS transistor 306 which connects a sixth node N6 to the supply voltage in response to the voltage of the fourth node N4; a fourth PMOS transistor 307 which connects the sixth node N6 with the second node N2 in response to the voltage of the fourth node N4; a first inverter 308 which inverts and outputs a voltage of the second node N2 to a seventh node N7; a fourth NMOS transistor 309 which connects the fourth node N4 with an eighth node N8 in response to a ground voltage of the seventh node N7; a fifth NMOS transistor 310 which connects the eighth node N8 to the ground voltage in response to the voltage of the seventh node N7; a second inverter 311 which inverts and outputs the voltage of the fourth node N4 to a ninth node N9; and a sixth NMOS transistor 312 which connects the fifth node N5 to the ground voltage in response to a voltage of the ninth node N9.

In FIG. 3, a signal on the seventh node N7 represent inventions a pulse signal P and a signal on the second node N2 represent inventions an inverted pulse signal PB.

The pulse generator 206 shown in FIG. 3 generates the pulse signal P and the inverted pulse signal PB when a clock signal CK rises.

The flip flop 200 shown in FIG. 2 may use a pulse generator with a different configuration, other than the pulse generator 206 shown in FIG. 3.

Figure 4:
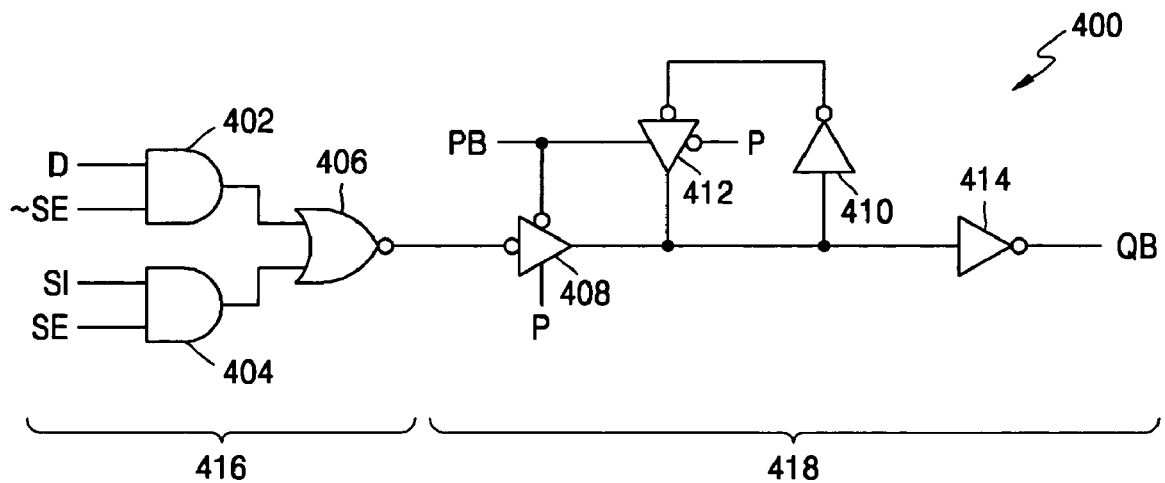
FIG. 4 is a circuit diagram of a flip flop according to an embodiment of the present invention.

FIG. 4 is a circuit diagram of a flip flop 400 according to an embodiment of the present invention.

The flip flop 400 shown in FIG. 4 includes a pulse generator (not shown for simplicity of illustration), i.e., only the multiplexer 416 and the latch unit 418 in the flip flop 200 of FIG. 2 are shown. The pulse generator can be the pulse generator 206 of FIG. 2, or a different pulse generator can be used.

The multiplexer 416 of the flip flop 400 includes a first AND gate 402 which performs an AND operation of a data D signal and an inverted scan enable ~SE signal; a second AND gate 404 which performs an AND operation of a scan input signal SI and a scan enable SE signal; and a NOR gate 406 which performs a NOR operation of an output signal of the first AND gate 402 and an output signal of the second AND gate 404.

Also, the latch unit 418 of the flip flop 400 can include: a first tri-state inverter 408 which inverts an output signal of the NOR gate 406 when a pulse signal P is logic high; a first inverter 410 which inverts an output signal of the first tri-state inverter 408; a second tri-state inverter 412 which inverts and transfers an output signal of the first inverter 410 to an input terminal of the first inverter 410 when an inverted pulse signal PB is logic high; and a second inverter 414 which inverts and outputs an output signal of the first tri-state inverter 408 to the outside. Here, an output signal QB of the second inverter 414 can be an inverted version of the data signal D or the scan input signal SI.

The multiplexer 416 outputs the data signal D to the first tri-state inverter 408 when the scan enable signal SE is logic low, and outputs the scan input signal SI to the first tri-state inverter 408 when the scan enable signal SE is logic high. That is, the multiplexer 416 uses a data path and a scan path separately, such that the multiplexer 416 acts as an inverter of received the data signal D if the scan enable signal SE is "0" and acts as an inverter of received the scan input signal SI if the scan enable signal SE is "1". Since data to be transmitted through the data path should be quickly transmitted, the data path is configured to reduce propagation delay, i.e., to improve speed in terms of speed. Since data to be transmitted through the scan path can be propagated relatively more slowly, the scan path can be configured in terms of hold violation, power consumption, reduction of area, etc.

The latch unit 418 can be a pulse-based latch which operates according to a pulse signal. A pulse signal generated by a pulse generator (not shown) operates one of the first and second tri-state inverters 408 and 412 of the latch unit 418 and selectively latches one of the data signal and the scan input signal. That is, the first tri-state inverter 408 does not operate (or in other words, isolates) if a pulse signal P generated by the pulse generator is logic low, and inverts and outputs an input signal if the pulse signal P is logic high.

The voltage level of a given signal output by the first tri-state inverter 408 is maintained by the first inverter 410 and the second tri-state inverter 412 as the given signal passes therethrough, respectively. The arrangement of the first inverter 410 and the second tri-state inverter 412 can be described as a voltage maintenance type of loop circuit.

If the pulse signal P is logic low, the first tri-state inverter 408 is turned off and the second tri-state inverter 412 is turned on, so that data in the latch unit 418 is maintained.

Figure 5:
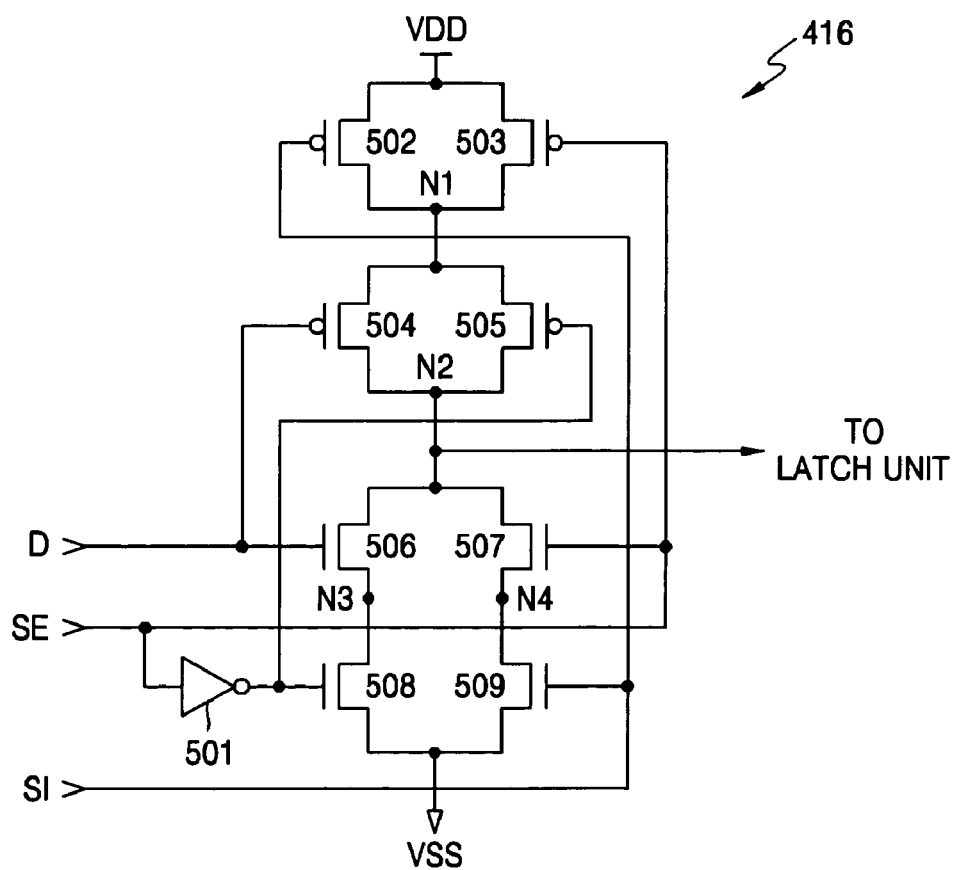
FIG. 5 is a circuit diagram of a multiplexer shown in FIG. 4, according to an embodiment of the present invention.

FIG. 5 is a circuit diagram of the multiplexer 416 shown in FIG. 4, according to an embodiment of the present invention;

A multiplexer 416 shown in FIG. 5 can include: a third inverter 501 which inverts a scan enable signal SE, a first PMOS transistor 502 which connects a first node N1 to a supply voltage VDD in response to a scan input signal SI; a second PMOS transistor 503 which connects the first node N1 to the supply voltage VDD in response to the scan enable signal SE; a third PMOS transistor 504 which connects the first node N1 with a second node N2 in response to a data signal D; a fourth PMOS transistor 505 which connects the first node N1 with the second node N2 in response to an inverted scan enable signal ~SE output from the third inverter 501; a first NMOS transistor 506 which connects the second node N2 with the third node N3 in response to the data signal D; a second NMOS transistor 507 which connects the second node N2 to a fourth node N4 in response to the scan enable signal SE; a third NMOS transistor 508 which connects the third node N3 to a ground voltage VSS in response to the inverted scan enable signal ~SE; and a fourth NMOS transistor 509 which connects the fourth node N4 to the ground voltage VSS in response to the scan input signal SI.

Here, the second node N2 of FIG. 5 can be connected to a latch unit of a flip flop.

Figure 6:
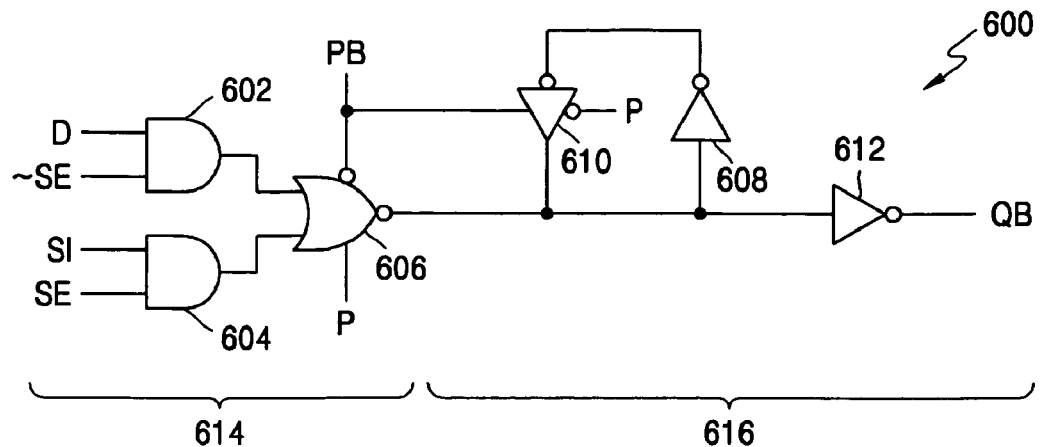
FIG. 6 is a circuit diagram of a flip flop according to an embodiment of the present invention.

FIG. 6 is a circuit diagram of a flip flop 600 according to an embodiment of the present invention.

The flip flop 600 shown in FIG. 6 includes a pulse generator (not shown for simplicity of illustration), i.e., only the multiplexer 614 and the latch unit 616 in the flip flop 600 of FIG. 6 are shown. The pulse generator can be the pulse generator 206 of FIG. 2, or a different pulse generator can be used.

A multiplexer 614 of the flip flop 600 can include: a first AND gate 602 which performs an AND operation of a data signal D and an inverted scan enable signal ~SE; a second AND gate 604 which performs an AND operation of a scan input signal SI and a scan enable signal SE; and a tri-state NOR gate 606 which performs a NOR operation of an output signal of the first AND gate 602 and an output signal of the second AND gate 604 when a pulse signal P is logic high.

A latch unit 616 of the flip flop 600 can include: a first inverter 608 which inverts an output signal of the tri-state NOR gate 606; a first tri-state inverter 610 which inverts and transfers an output signal of the first inverter 608 to an input terminal of the first inverter 608 when an inverted pulse signal PB is logic high; and a second inverter 612 which inverts and transfers an output signal of the tri-state NOR gate 606 to the outside.

In the flip flop 600, an input terminal of the latch unit 616 is connected to the multiplexer 614, without the first tri-state inverter 408 of the flip flop 400 shown in FIG. 4. In the flip flop 600 shown in FIG. 6, the multiplexer 614 is implemented by using a tri-state NOR gate.

If the pulse signal P is logic low, the multiplexer 614 prevents a signal from being output and the latch unit 616 maintains the level of the signal via a voltage maintenance type of circuit loop that includes the first inverter 608 and the first tri-state inverter 610. Also, a signal QB output by the second inverter 612 is maintained while the pulse signal P is logic low.

If the pulse signal P is logic high, the first tri-state inverter 610 of the latch unit 616 does not operate (or, in other words, blocks) and, accordingly, the level of the signal is no longer maintained. The multiplexer 614 selects the data signal D or the scan input signal SI according to the state of the scan enable signal SE and transfers the selected signal to the latch unit 616.

By removing the tri-state inverter 610 of the latch unit 616, the flip flop 600 has a shorter data path and obtains a relative faster speed.

Figure 7:
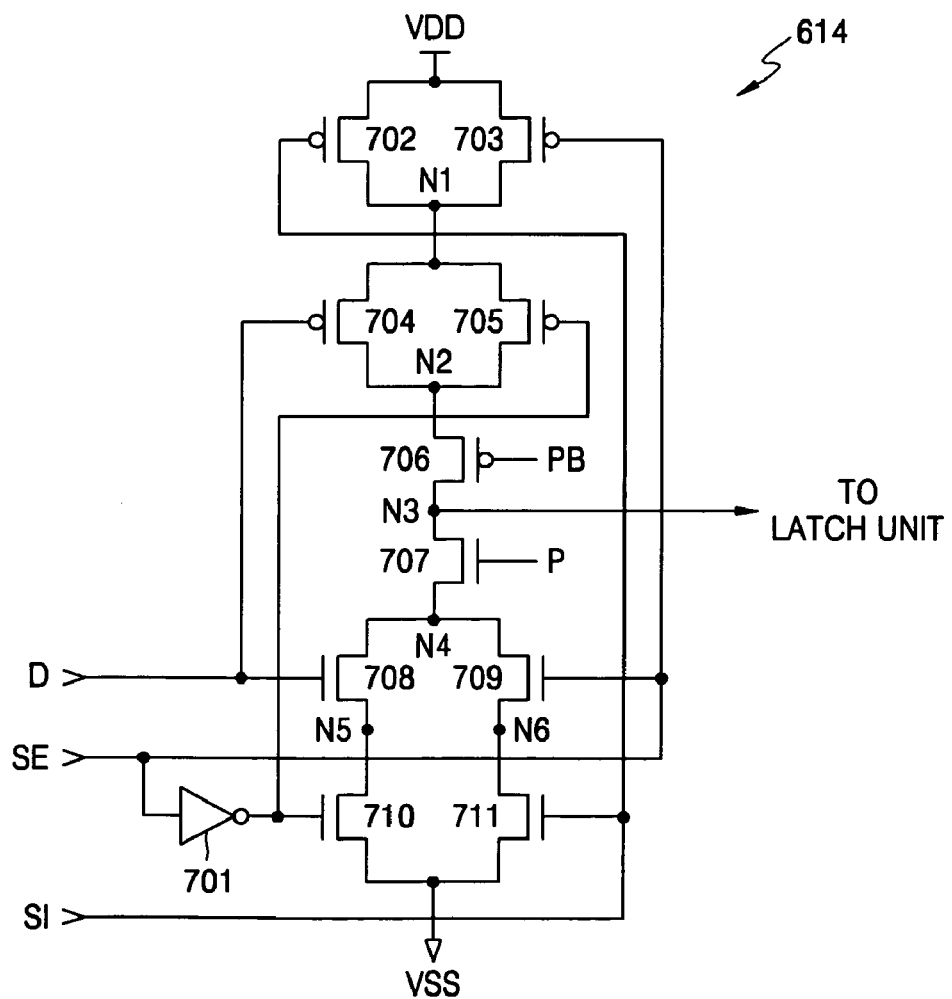
FIG. 7 is a circuit diagram of a multiplexer shown in FIG. 6, according to an embodiment of the present invention.

FIG. 7 is a circuit diagram of the multiplexer 614 shown in FIG. 6, according to an embodiment of the present invention.

The multiplexer 614 shown in FIG. 7 can include: a third inverter 701 which inverts a scan enable signal SE; a first PMOS transistor 702 which connects a first node N1 to a supply voltage VDD in response to a scan input signal SI; a second PMOS transistor 703 which connects the first node N1 to the supply voltage VDD in response to the scan enable signal SE; a third PMOS transistor 704 which connects the first node N1 with a second node N2 in response to a data signal D; a fourth PMOS transistor 705 which connects the first node N1 with the second node N2 in response to an inverted scan enable signal ~SE generated as an output of the third inverter 701; a fifth PMOS transistor 706 which connects the second node N2 with a third node N3 in response to an inverted pulse signal PB; a first NMOS transistor 707 which connects the third node N3 with a fourth node N4 in response to a pulse signal P; a second NMOS transistor 708 which connects the fourth node N4 with a fifth node N5 in response to the data signal D; a third NMOS transistor 709 which connects the fourth node N4 with a sixth node N6 in response to the scan enable signal SE; a fourth NMOS transistor 710 which connects a fifth node N5 to a ground voltage VSS in response to the inverted scan enable signal ~SE by the third inverter 701; and a fifth NMOS transistor 711 which connects the sixth node N6 to the ground voltage VSS in response to the scan input signal SI.

Here, the third node N3 is connected to the latch unit 616 of the flip flop 600.

Figure 8:
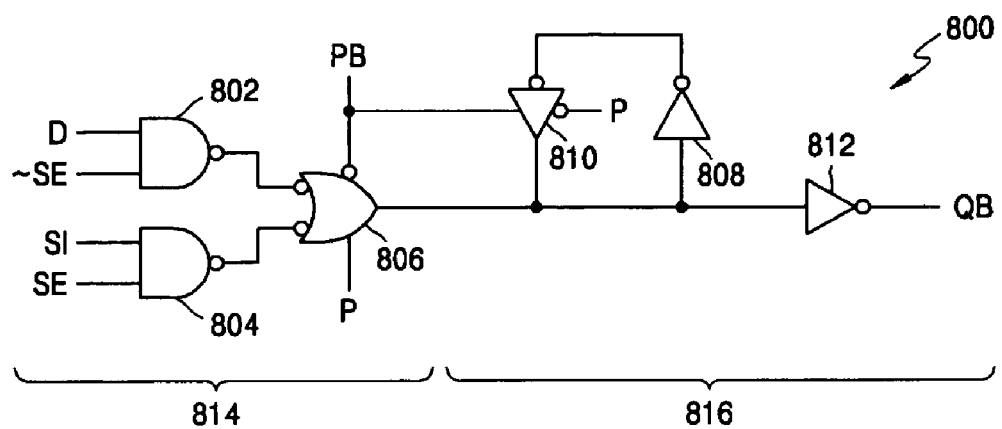
FIG. 8 is a circuit diagram of a flip flop according to an embodiment of the present invention.

FIG. 8 is a circuit diagram of a flip flop 800 according to an embodiment of the present invention.

The flip flop 800 shown in FIG. 8 includes a pulse generator (not shown for simplicity of illustration), i.e., only the multiplexer 814 and the latch unit 816 in the flip flop 800 of FIG. 8 are shown. The pulse generator can be the pulse generator 206 of FIG. 2, or a different pulse generator can be used.

In the flip flop 800, as contrasted with the flip-flop 400 of FIG. 4, a tri-state NAND gate 806 is included in a multiplexer 814 while the tri-state inverter 408 is removed from the latch unit 418.

The multiplexer 814 of the flip flop 800 can include: a first NAND gate 802 which performs a NAND operation of a data signal D and an inverted scan enable signal ~SE; a second NAND gate 804 which performs a NAND operation of a scan input signal SI and a scan enable signal SE; and a tri-state NAND gate 806 which performs a NAND operation of an output signal of the first NAND gate 802 and an output signal of the second NAND gate 804 when a pulse signal P is logic high.

Also, the latch unit 816 of the flip flop 800 can include: a first inverter 808 which inverts an output signal of the tri-state NAND gate 806; a first tri-state inverter 810 which inverts and transfers an output signal of the first inverter 808 to an input terminal of the first inverter 808 when an inverted pulse signal PB is logic high; and a second inverter 812 which inverts and outputs an output signal of the tri-state NAND gate 806 to the outside.

Figure 9:
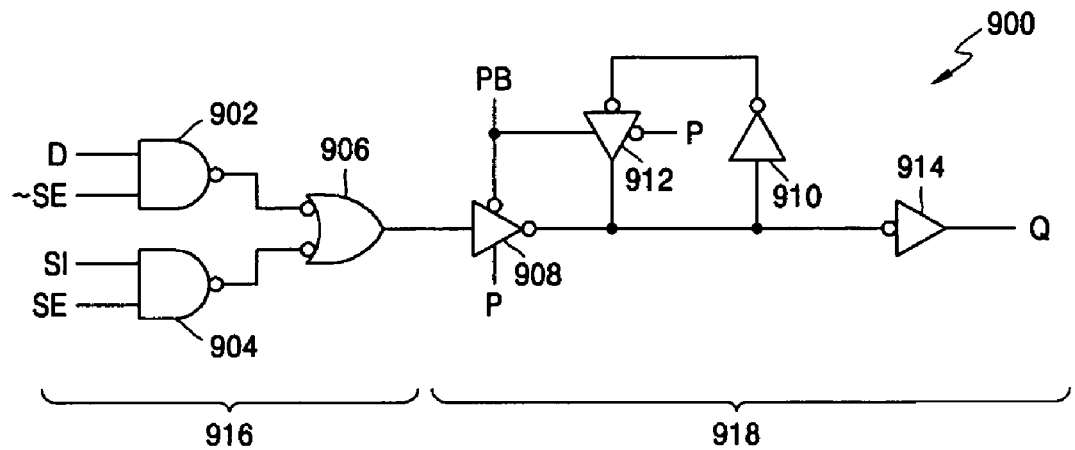
FIG. 9 is a circuit diagram of a flip flop according to an embodiment of the present invention.

FIG. 9 is a circuit diagram of a flip flop 900 according to an embodiment of the present invention.

The flip flop 900 shown in FIG. 9 includes a pulse generator (not shown for simplicity of illustration), i.e., only the multiplexer 916 and the latch unit 918 in the flip flop 900 of FIG. 9 are shown. The pulse generator can be the pulse generator 206 of FIG. 2, or a different pulse generator can be used.

n the flip flop 900, a multiplexer 916 is implemented by a NAND gate and a tri-state inverter 908 is added to a latch unit 918, in contrast to the flip flop 800 shown in FIG. 8.

The multiplexer 916 of the flip flop 900 can include: a first NAND gate 902 which receives a data signal D and an inverted scan enable signal ~SE and performs a NAND operation of the data signal D and the inverted scan enable signal ~SE; a second NAND gate 904 which receives a scan input signal SI and a scan enable signal SE and performs a NAND operation of the scan input signal SI and the scan enable signal SE; and a third NAND gate 906 which performs a NAND operation of an output signal of the first NAND gate 902 and an output signal of the second NAND gate 904.

The latch unit 918 of the flip flop 900 can include: a first tri-state inverter 908 which inverts an output signal of the third NAND gate 906 when a pulse signal P is logic high; a first inverter 910 which inverts an output signal of the first tri-state inverter 908; a second tri-state inverter 912 which inverts and transfers an output signal of the first inverter 910 to an input terminal of the first inverter 910 when an inverted pulse signal PB is logic high; and a second inverter 914 which inverts and outputs an output signal of the first tri-state inverter 908 to the outside.

The multiplexer 916 transfers the data signal D or the scan input signal SI to the latch unit 918 in response to the scan enable signal SE. That is, the multiplexer 916 transfers the data signal D to the latch unit 918 if the scan enable signal SE is logic low and transfers the scan input signal SI to the latch unit 918 if the scan enable signal SE is logic high.

The latch unit 918 latches a signal output from the multiplexer 916 and outputs the signal through the second inverter 914 if the pulse signal P is logic high. If the pulse signal P is logic low, the latched signal is maintained via a voltage maintenance type of loop circuit that includes the inverter 910 and the tri-state inverter 912, and so that the output level of the latch unit 918 is maintained.

Figure 10:
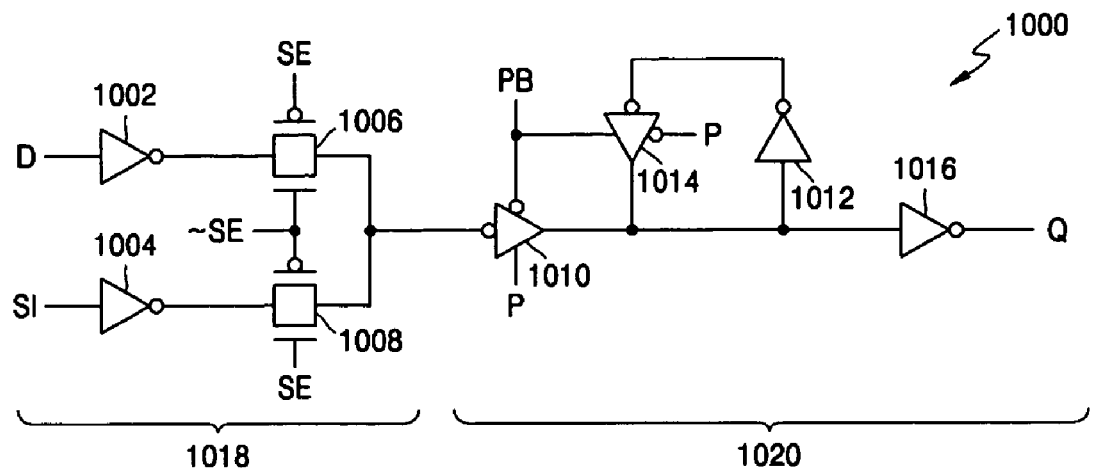
FIG. 10 is a circuit diagram of a flip flop according to an embodiment of the present invention.

FIG. 10 is a circuit diagram of a flip flop 1000 according to an embodiment of the present invention.

The flip flop 1000 shown in FIG. 10 includes a pulse generator (not shown for simplicity of illustration), i.e., only the multiplexer 1018 and the latch unit 1020 in the flip flop 1000 of FIG. 10 are shown. The pulse generator can be the pulse generator 206 of FIG. 2, or a different pulse generator can be used.

In the flip flop 1000, a multiplexer 1018 can include transmission gates.

The multiplexer 1018 of the flip flop 1000 can include: a first inverter 1002 which inverts a data signal D; a second inverter 1004 which inverts a scan input signal SI; a first transmission gate 1006 which transfers an output signal of the first inverter 1002 when an inverted scan enable signal ~SE is logic high; and a second transmission gate 1008 which transfers an output signal of the second inverter 1004 when a scan enable signal SE is logic high.

A latch unit 1020 of the flip flop 1000 can include: a first tri-state inverter 1010 which inverts (when the pulse signal P is logic high) a combined signal resulting from the outputs of the first transmission gate 1006 and the second transmission gate 1008 both being connected to a third inverter 1012 which inverts an output signal of the first tri-state inverter 1010; a second tri-state inverter 1014 which inverts and transfers an output signal of the third inverter 1012 to an input terminal of the third inverter 1012 when an inverted pulse signal PB is logic high; and a fourth inverter 1016 which inverts and outputs an output signal of the first tri-state inverter 1010 to the outside.

The multiplexer 1018 of the flip flop 1000 shown in FIG. 10 is different in configuration from the multiplexer 916 of the flip flop 900 shown in FIG. 9. That is, the multiplexer 1018 transfers the data signal D to the latch unit 1020 if the scan enable signal SE is logic low and transfers the scan input signal SI to the latch unit 1020 if the scan enable signal SE is logic high, using a transmission gate instead of a NAND gate.

Figure 11:
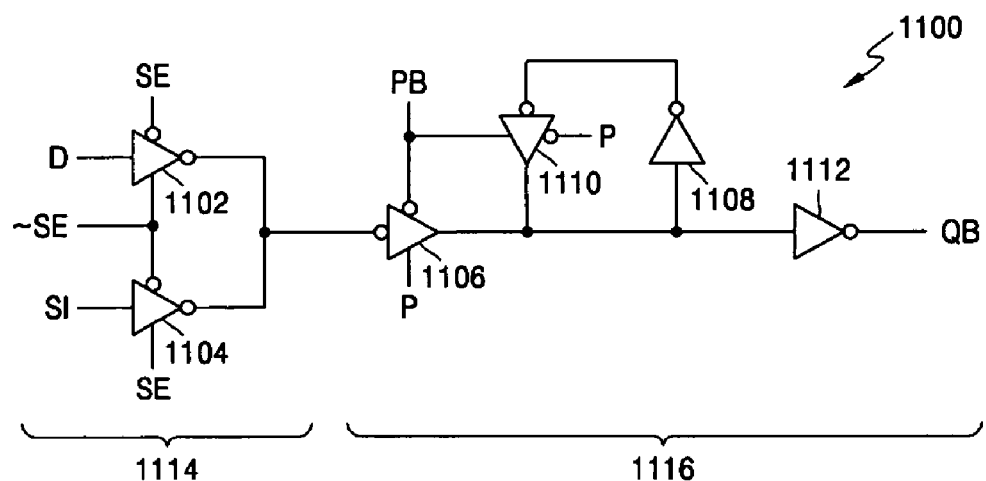
FIG. 11 is a circuit diagram of a flip flop according to an embodiment of the present invention.

FIG. 11 is a circuit diagram of a flip flop 1100 according to an embodiment of the present invention.

The flip flop 1100 shown in FIG. 11 includes a pulse generator (not shown for simplicity of illustration), i.e., only the multiplexer 1114 and the latch unit 1116 in the flip flop 1100 of FIG. 11 are shown. The pulse generator can be the pulse generator 206 of FIG. 2, or a different pulse generator can be used.

In the flip flop 1100, a multiplexer 1114 can include tri-state inverters.

The multiplexer 1114 includes a first tri-state inverter 1102 which inverts a data signal D if an inverted scan enable signal ~SE is logic high and a second tri-state inverter 1104 which inverts a scan input signal SI if the scan enable signal SE is logic high.

A latch unit 1116 of the flip flop 1110 can include: a third tri-state inverter 1106 which inverts a signal output from the first tri-state inverter 1102 or the second tri-state inverter 1104 when a pulse signal P is logic high; a first inverter 1108 which inverts an output signal of the third tri-state inverter 1106; a fourth tri-state inverter 1110 which inverts and transfers an output signal of the first inverter 1108 to an input terminal of the first inverter 1108 when an inverted pulse signal PB is logic high; and a second inverter 1112 which inverts and outputs an output signal of the third tri-state inverter 1106 to the outside.

If the scan enable signal SE is logic low, the first tri-state inverter 1102 is activated so to invert and output the data signal D to the latch unit 1116. If the scan enable signal SE is logic high, the second tri-state inverter 1104 is activated so to invert and output the scan input signal SI to the latch unit 1116.

Figure 12:
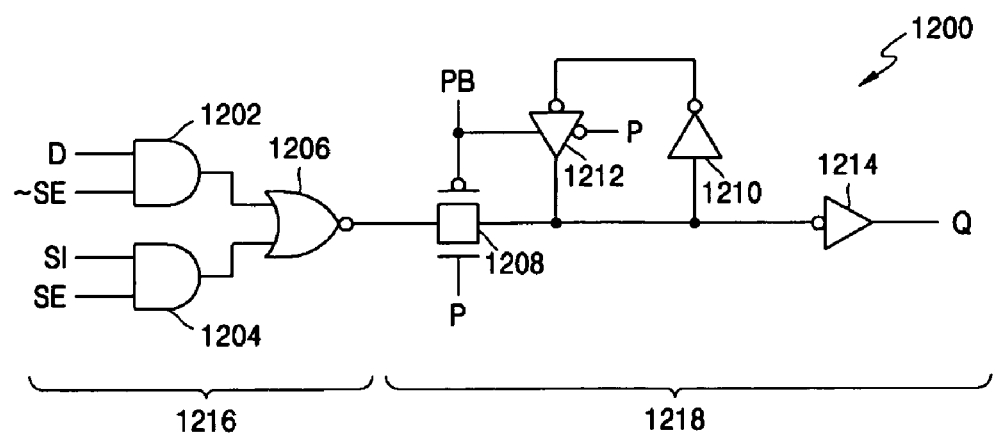
FIG. 12 is a circuit diagram of a flip flop according to a an embodiment of the present invention.

FIG. 12 is a circuit diagram of a flip flop 1200 according to an embodiment of the present invention.

The flip flop 1200 shown in FIG. 12 includes a pulse generator (not shown for simplicity of illustration), i.e., only the multiplexer 1216 and the latch unit 1218 in the flip flop 1200 of FIG. 12 are shown. The pulse generator can be the pulse generator 206 of FIG. 2, or a different pulse generator can be used.

The flip flop 1200, as contrasted with the flip-flop 400 shown in FIG. 4A, can include a transmission gate 1208 in place of the first tri-state inverter 408. A transmission gate has an operating speed faster than a tri-state inverter, although a consideration is that a supply voltage VDD and a ground voltage are not connected to the transmission gate.

A multiplexer 1216 of the flip flop 1200 can include: a first AND gate 1202 which performs an AND operation of a data signal D and an inverted scan enable signal ~SE; a second AND gate 1204 which performs an AND operation of a scan input signal SI and a scan enable signal SE; and a NOR gate 1206 which performs a NOR operation of an output signal of the first AND gate 1202 and an output signal of the second AND gate 1204.

A latch unit 1218 of the flip flop 1200 can include: a transmission gate 1208 which transfers an output signal of the NOR gate 1206 when a pulse signal P is logic high; a first inverter 1210 which inverts an output signal of the transmission gate 1208; a first tri-state inverter 1212 which inverts and transfers an output signal of the first inverter 1210 to an input terminal of the first inverter 1210 when an inverted pulse signal PB is logic high; and a second inverter 1214 which inverts and outputs an output signal of the transmission gate 1208 to the outside.

The multiplexer 1216 can operate in the manner as the multiplexer 416 of FIG. 4. Signal capturing operation can be performed by the transmission gate 1208 in the latch unit 1218.

Figure 13:
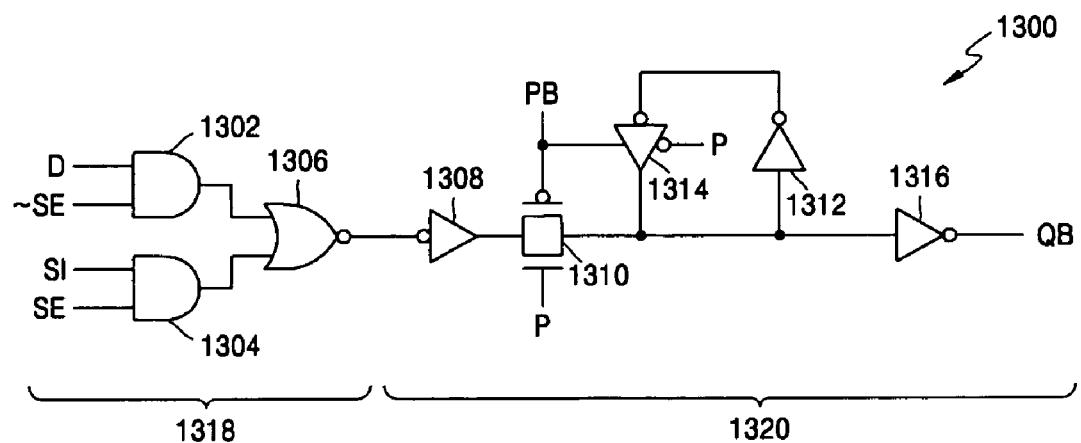
FIG. 13 is a circuit diagram of a flip flop according to an embodiment of the present invention.

FIG. 13 is a circuit diagram of a flip flop 1300 according to an embodiment of the present invention.

The flip flop 1300 shown in FIG. 13 includes a pulse generator (not shown for simplicity of illustration), i.e., only the multiplexer 1318 and the latch unit 1320 in the flip flop 1300 of FIG. 13 are shown. The pulse generator can be the pulse generator 206 of FIG. 2, or different pulse generator can be used.

A multiplexer 1318 of the flip flop 1300 can include: a first AND gate 1302 which performs an AND operation of a data signal D and an inverted scan enable signal ~SE; a second AND gate 1304 which performs an AND operation of a scan input signal SI and a scan enable signal SE; and a NOR gate 1306 which performs a NOR operation of an output signal of the first AND gate 1302 and an output signal of the second AND gate 1304.

A latch unit 1320 of the flip flop 1300 can include: a first inverter 1308 which inverts an output signal of the NOR gate 1306; a transmission gate 1310 which transmits an output signal of the first inverter 1308 when a pulse signal P is logic high; a second inverter 1312 which inverts an output signal of the transmission gate 1310; a first tri-state inverter 1314 which inverts and transmits an output signal of the second inverter 1312 to an input terminal of the second inverter 1312 when an inverted pulse signal PB is logic high; and a third inverter 1316 which inverts and outputs an output signal of the transmission gate 1310 to the outside.

The flip flop 1300 can be described as having a three-tiered structure in which an inverter 1308 is inserted between the multiplexer 1318 and the transmission gate 1310. In contrast, the flip flop 1200 shown in FIG. 12 can be described as having a two-tiered structure that includes the NOR gate 1206 and the transmission gate 1208.

Figure 14:
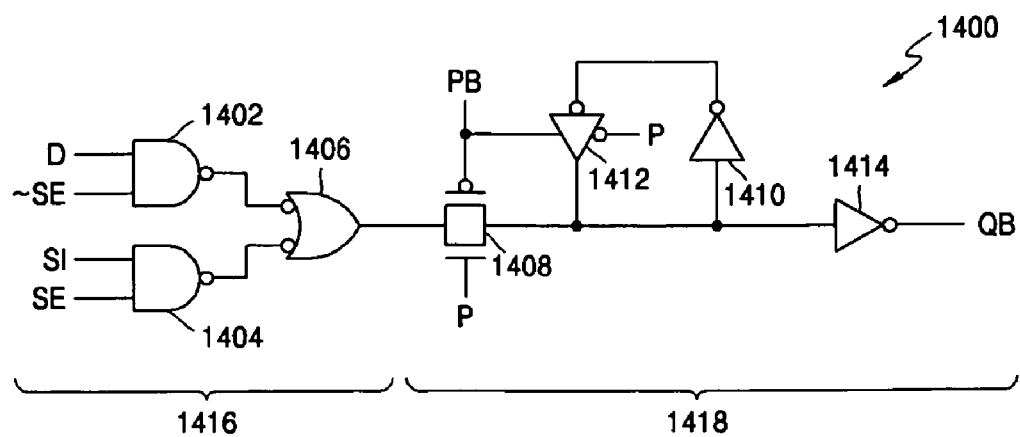
FIG. 14 is a circuit diagram of a flip flop according to an embodiment of the present invention.

FIG. 14 is a circuit diagram of a flip flop 1400 according to an embodiment of the present invention.

The flip flop 1400 shown in FIG. 14 includes a pulse generator (not shown for simplicity of illustration), i.e., only the multiplexer 1416 and the latch unit 1418 in the flip flop 1400 of FIG. 14 are shown. The pulse generator can be the pulse generator 206 of FIG. 2, or a different pulse generator can be used.

The flip flop 1400 has a configuration in which the latch unit 1320 of FIG. 13 is connected to the multiplexer 916 of the flip flop 900 shown in FIG. 9.

The multiplexer 1416 of the flip flop 1400 can include: a first NAND gate 1402 which performs a NAND operation of a data signal D and an inverted scan enable signal ~SE; a second NAND gate 1404 which performs a NAND operation of a scan input signal SI and a scan enable signal SE; and a third NAND gate 1406 which performs a NAND operation of an output signal of the first NAND gate 1402 and an output signal of the second NAND gate 1404.

Also, a latch unit 1418 of the flip flop 1400 can include: a transmission gate 1408 which transmits an output signal of the third NAND gate 1406 when a pulse signal P is logic high; a first inverter 1410 which inverts an output signal of the transmission gate 1408; a first tri-state inverter 1412 which inverts and transmits an output signal of the first inverter 1410 to an input terminal of the first inverter 1410 when an inverted pulse signal PB is logic high; and a second inverter 1414 which inverts and outputs an output signal of the transmission gate 1408 to the outside.

Figure 15:
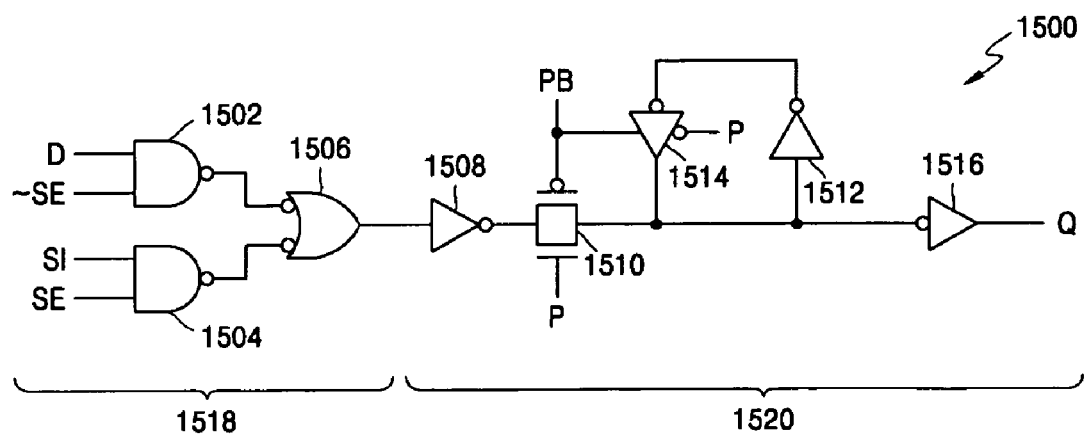
FIG. 15 is a circuit diagram of a flip flop according to another of the present invention.

FIG. 15 is a circuit diagram of a flip flop 1500 according to an embodiment of the present invention.

The flip flop 1500 shown in FIG. 15 includes a pulse generator (not shown for simplicity of illustration), i.e., only the multiplexer 1518 and the latch unit 1520 in the flip flop 1500 of FIG. 15 are shown. The pulse generator can be the pulse generator 206 of FIG. 2, or a different pulse generator can be used.

The flip flop 1500 can be described as having a three-tiered structure in which an inverter is inserted between a multiplexer 1518 (corresponding to multiplexer 1416 in FIG. 4) and a transmission gate 1510 (corresponding to transmission gate 1408 in FIG. 14).

The multiplexer 1518 of the flip flop 1500 can include: a first NAND gate 1502 which performs a NAND operation of a data signal D and an inverted scan enable signal ~SE; a second NAND gate 1504 which performs a NAND operation of a scan input signal SI and a scan enable signal SE; and a third NAND gate 1506 which performs a NAND operation of an output signal of the first NAND gate 1502 and an output signal of the second NAND gate 1504.

A latch unit 1502 of the flip flop 1500 can include: a first inverter 1508 which inverts an output signal of the third NAND gate 1506; a transmission gate 1510 which transmits an output signal of the first inverter 1508 when a pulse signal P is logic high; a second inverter 1512 which inverts an output signal of the transmission gate 1510; a first tri-state inverter 1514 which inverts and transmits an output signal of the second inverter 1512 to an input terminal of the second inverter 1512 when an inverted pulse signal PB is logic high; and a third inverter 1516 which inverts and outputs an output signal of the transmission gate 1510 to the outside.

Figure 16:
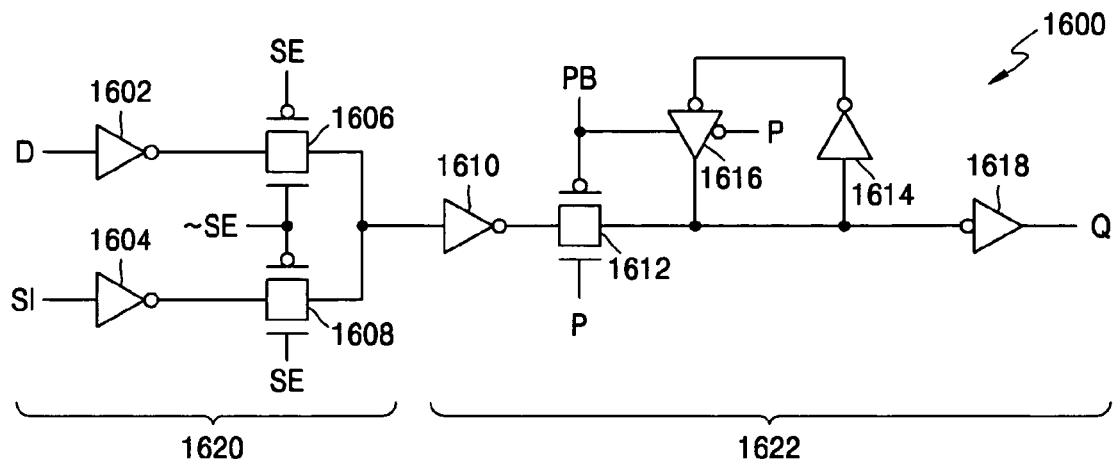
FIG. 16 is a circuit diagram of a flip flop according to another of the present invention.

FIG. 16 is a circuit diagram of a flip flop 1600 according to an embodiment of the present invention.

The flip flop 1600 shown in FIG. 16 can include: a multiplexer 1620 which selects one of a data signal D and a scan input signal SI using transmission gates, as in the multiplexer 1018 shown in FIG. 10; and a latch unit 1622 that includes an inverter 1610 and a transmission gate 1612, arranged similarly to the latch unit 1320 shown in FIG. 13.

The multiplexer 1620 can include: the (third) inverter 1602 which inverts a data signal D; a second inverter 1604 which inverts a scan input signal SI; a first transmission gate 1606 which transmits an output of the first inverter 1602 when an inverted scan enable signal ~SE is logic high; and a second transmission gate 1608 which transmits an output of the second inverter 1604 when the scan enable signal SE is logic high.

The latch unit can include: a third inverter 1610 which inverts an output signal of the first transmission gate 1606 or an output signal of the second transmission gate 1608; a third transmission gate 1612 which transmits an output signal of the third inverter 1610 when a pulse signal P is logic high; a fourth inverter 1614 which inverts an output signal of the third transmission gate 1612; a first tri-state inverter 1616 which inverts and transfers an output signal of the fourth inverter 1614 to an input terminal of the fourth inverter 1614 when an inverted pulse signal PB is logic high; and a fifth inverter 1618 which inverts and transfers an output signal of the third transmission gate 1612 to the outside.

Figure 17:
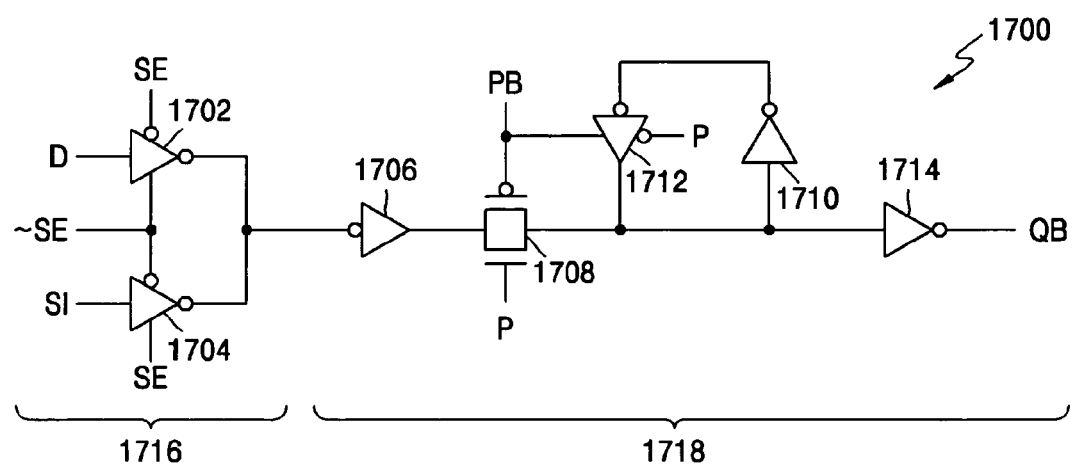
FIG. 17 is a circuit diagram of a flip flop according to another of the present invention.

FIG. 17 is a circuit diagram of a flip flop 1700 according to an embodiment of the present invention.

The flip flop 1700 shown in FIG. 17 can include: a multiplexer 1716 which selects one of a data signal D and a scan input signal SI using two tri-state inverters, as in the multiplexer 1114 of the flip flop 1100 shown in FIG. 11; and a latch unit 1718 that includes an inverter 1706 and a transmission gate 1708, arranged similarly to the latch unit 1320 shown in FIG. 13.

The multiplexer 1716 can include: a first tri-state inverter 1702 which inverts a data signal D when an inverted scan enable signal ~SE is logic high; and a second tri-state inverter 1704 which inverts a scan input signal SI when a scan enable signal SE is logic high.

The latch unit 1708 can include: a first inverter 1706 which inverts an output signal of the first tri-state inverter 1702 or an output signal of the second tri-state inverter 1704; a transmission gate 1708 which transfers an output signal of the first inverter 1706 when a pulse signal P is logic high; a second inverter 1710 which inverts an output signal of the transmission gate 1708; a third tri-state inverter 1712 which inverts and transfers an output signal of the second inverter 1710 to an input terminal of the second inverter 1710 when an inverted pulse signal PB is logic high; and a third inverter 1714 which inverts and outputs an output signal of the transmission gate 1708 to the outside.

FIGS. 18A through 18F are circuit diagrams of latch units used in flip flops according to s of the present invention.

Figure 18A:
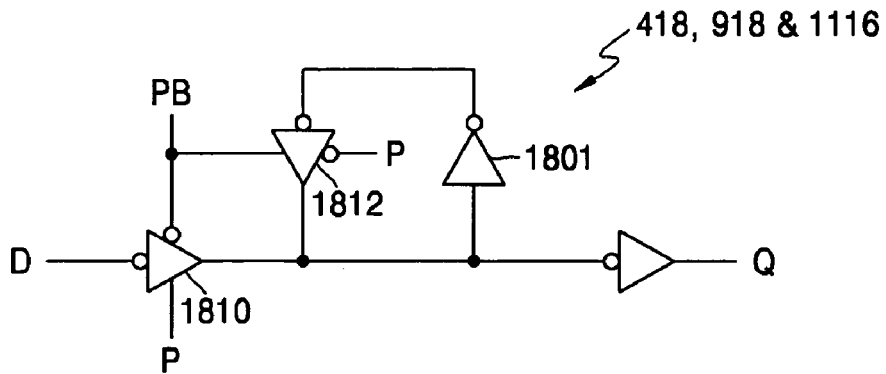
FIGS. 18A through 18F are circuit diagrams of latch units used in flip flops according to embodiments of the present invention, respectively.

FIG. 18A is an example circuit diagram of the latch units 418, 918 and 1116 shown in FIGS. 4, 9, and 11, respectively. The latch unit shown in FIG. 18A includes a first tri-state inverter 1810 for latching an input signal and a voltage maintenance type of loop circuit that includes a second tri-state inverter 1812 for re-inverting the latched data that has been inverted by an inverter 1801, thus maintaining a voltage level of the latched data.

Figure 18B:
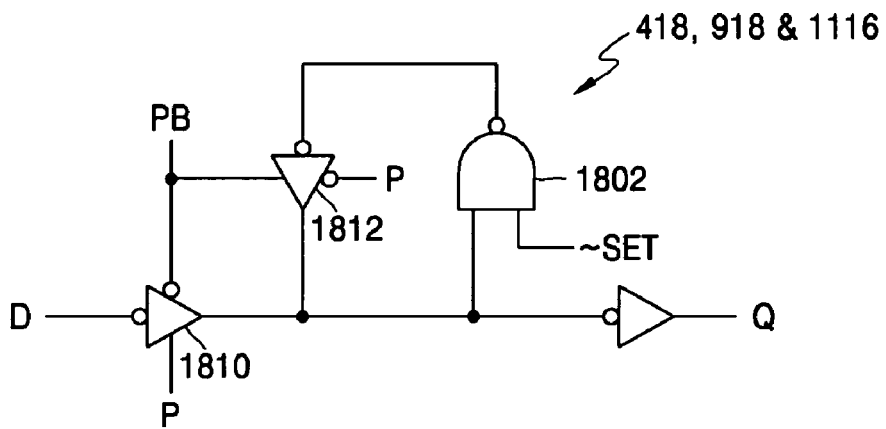

A latch unit shown in FIG. 18B has a voltage maintenance type of loop circuit that uses a NAND gate 1802 instead of the inverter 1801 shown in FIG. 18A. The NAND gate 1802 receives an output of tri-state inverters 1810 & 1812 and an inverted set signal ~SET and performs a NAND operation of the output and the inverted set signal ~SET. If a set signal is logic high, then an output of the latch unit becomes logic high. Accordingly, the latch unit can be set according to the inverted set signal ~SET.

Figure 18C:
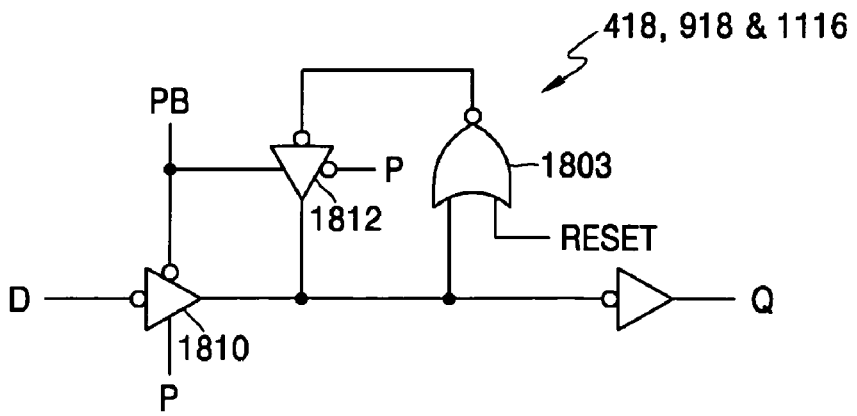

A latch unit shown in FIG. 18C has a voltage maintenance type of loop circuit that uses a NOR gate 1803 instead of the inverter 1801 shown in FIG. 18A. The NOR gate 1803 receives an output of tri-state inverters 1810 & 1812 and a reset signal RESET and performs a NOR operation of the output and the reset signal RESET. If the reset signal RESET is logic high, then an output of the latch unit becomes logic low. Accordingly, the latch unit can be reset according to the reset signal RESET.

Figure 18D:
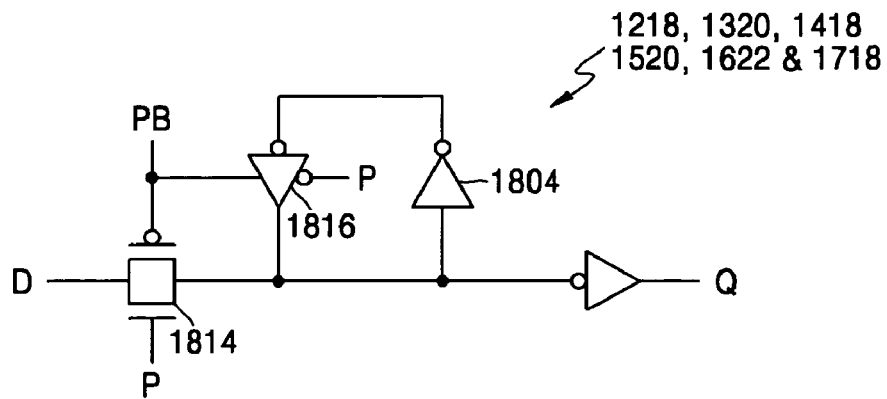

FIG. 18D is a circuit diagram of the latch units 1218, 1320, 1418, 1520, 1622 and 1718 shown in FIGS. 12 through 17, respectively. A latch unit shown in FIG. 18D includes a transmission gate 1814 for latching an input signal, and a voltage maintenance type of loop circuit that includes an inverter 1804 and a tri-state inverter 1816 for maintaining a voltage level of the latched data.

Figure 18E:
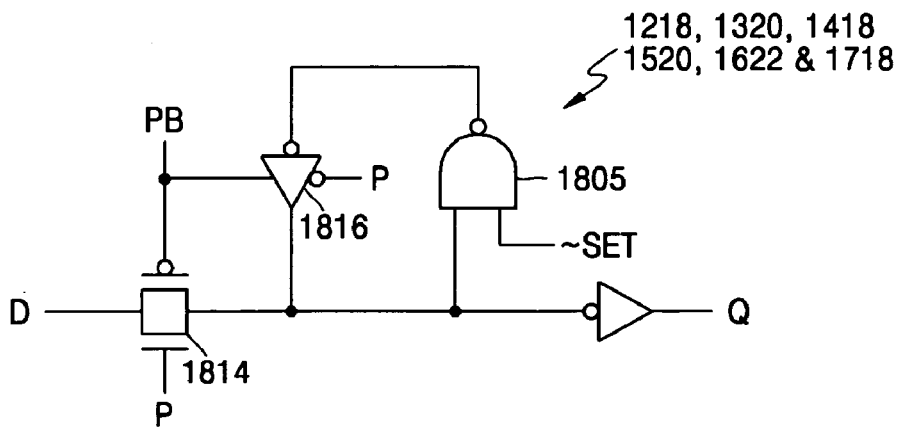

A latch unit shown in FIG. 18E has a voltage maintenance type of loop circuit that uses a NAND gate 1805 instead of the inverter 1804 shown in FIG. 18D. The NAND gate 1805 receives an output of the tri-state inverter 1816 and an inverted set signal ~SET and performs a NAND operation and on the inverted set signal ~SET. If a set signal is logic high, then an output of the latch unit becomes logic high. Accordingly, the latch unit can be set according to the inverted set signal ~SET.

Figure 18F:
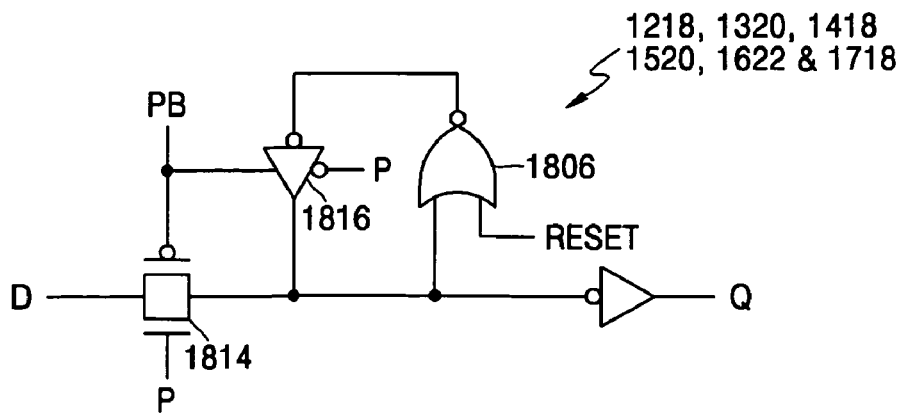

A latch unit shown in FIG. 18F has a voltage maintenance type of loop circuit that uses a NOR gate 1806 instead of the inverter 1804 of FIG. 18D. The NOR gate 1806 receives an output of the tri-state inverter 1816 and a reset signal RESET and performs a NOR operation of the output and the reset signal RESET. If the reset signal RESET is logic high, then an output of the latch unit becomes logic low. Accordingly, the latch unit can be reset according to the reset signal RESET.

As described above, according to a flip flop of the present invention, it is possible to a signal transmission path, to reduce a D-to-Q delay, and/or to provide a scan function in a small area.

With some embodiments of the present invention having thus been described, it will be obvious that the same may be varied in many ways. Such variations are not to be regarded as a departure from the spirit and scope of the present invention, and all such modifications are intended to be included within the scope of the present invention.

The invention claimed is:

1. A pulse-based flip flop which outputs a scan input signal and a data signal, the flip-flop comprising:
    a pulse generator to generate a pulse signal for coordinating operation of the flip flop, the pulse signal includes only a non-inverted pulse signal and an inverted pulse signal;
    a multiplexer to receive the data signal, the scan input signal, and a scan enable signal, and to selectively output one of the data signal and the scan input signal in response to the scan enable signal, wherein the multiplexer performs the operation of selective outputting irrespective of the non-inverted pulse signal and the inverted pulse signal; and
    a latch unit to transfer therethrough the data signal or the scan input signal received from the multiplexer according to the non-inverted pulse signal and the inverted pulse signal, wherein the latch unit latches the data signal or the scan input signal received from the multiplexer through a common latching path, wherein the latch unit includes:
a switching circuit connected between the multiplexer and a node, the switching circuit being arranged to selectively transfer one of the data signal and the scan input signal received from the multiplexer to the node according to an activation of one of the inverted pulse signal and the non-inverted pulse signal;
an output circuit connected to the node; and
a voltage maintenance type of circuit loop connected to the node, the voltage maintenance type of circuit loop being arranged to selectively maintain a voltage at the node according to an activation of the other of the one of the inverted pulse signal and the non-inverted pulse signal being activated for selectively transferring one of the data signal and the scan input signal.

2. The flip flop of claim 1, wherein the multiplexer includes:
a first AND gate to perform an AND operation on the data signal and an inverted scan enable signal,
a second AND gate to perform an AND operation on the scan input signal and the scan enable signal, and
a NOR gate to perform a NOR operation on an output signal of the first AND gate and an output signal of the second AND gate.

3. The flip flop of claim 2, wherein the NOR gate of the multiplexer is a tri-state NOR gate.

4. The flip flop of claim 1, wherein the multiplexer comprises:
a third inverter to invert the scan enable signal;
a first PMOS transistor to connect a first node to a supply voltage in response to the scan input signal;
a second PMOS transistor to connect the first node to the supply voltage in response to the scan enable signal;
a third PMOS transistor to connect the first node with a second node in response to the data signal;
a fourth PMOS transistor to connect the first node with the second node in response to an output signal of the third inverter;
a first NMOS transistor to connect the second node with a third node in response to the data signal;
a second NMOS transistor to connect the second node with a fourth node in response to the scan enable signal;
a third NMOS transistor to connect the third node to a ground voltage in response to an output signal of the third inverter; and
a fourth NMOS transistor to connect the fourth node to the ground voltage in response to the scan input signal, wherein the second node is connected to the latch unit.

5. The flip flop of claim 1, wherein the multiplexer comprises:
a first inverter to invert the scan enable signal;
a first PMOS transistor to connect a first node to a supply voltage in response to the scan input signal;
a second PMOS transistor to connect the first node to the supply voltage in response to the scan enable signal;
a third PMOS transistor to connect the first node with a second node in response to the data signal;
a fourth PMOS transistor to connect the first node with the second node in response to an output signal of the first inverter;
a fifth PMOS transistor to connect the second node with a third node in response to the inverted pulse signal;
a first NMOS transistor to connect the third node with a fourth node in response to the non-inverted pulse signal;
a second NMOS transistor to connect the fourth node with a fifth node in response to the data signal;
a third NMOS transistor to connect the fourth node with a sixth node in response to the scan enable signal;
a fourth NMOS transistor to connect the fifth node to a ground voltage in response to an output signal of the first inverter; and
a fifth NMOS transistor to connect the sixth node to the ground voltage in response to the scan input signal, wherein the third node is connected to the latch unit.

6. The flip flop of claim 1, wherein the multiplexer comprises:
a first inverter to invert the data signal;
a second inverter to invert the scan input signal;
a first transmission gate to transfer an output of the first inverter when an inverted version of the scan enable signal is logic high; and
a second transmission gate to transfer an output of the second inverter when the scan enable signal is logic high.

7. The flip flop of claim 1, wherein the multiplexer comprises:
a first tri-state inverter to invert the data signal when an inverted scan enable signal is logic high; and
a second tri-state inverter to invert the scan input signal when the scan enable signal is logic high.

8. The flip flop of claim 1, wherein:
the latch unit has a main signal path therethrough; and
the voltage maintenance type of circuit loop includes a plurality of nodes only one of which is connected to the main signal path.

9. The flip flop of claim 1, wherein:
the latch unit has a main signal path therethrough; and
the voltage maintenance type of circuit loop includes a signal sub-path theretbrough that shares a node with the main path but otherwise is separate therefrom.

10. The flip flop of claim 1, wherein the voltage maintenance type of circuit loop includes at least one of the following:
an inverter to which is input a signal output by the multiplexer;
a NAND gate to which is input a signal output by the multiplexer and an inverted version of a set signal such that an output of the latch unit can be set according to the inverted set signal; and
a NOR gate to which is input a signal output by the multiplexer and a reset signal such that an output of the latch unit can be set according to reset signal.

11. The flip flop of claim 1, wherein the multiplexer includes:
a first NAND gate to perform a NAND operation upon the data signal and an inverted scan enable signal;
a second NAND gate to perform a NAND operation upon the scan input signal and a scan enable signal; and
a third NAND gate to perform a NAND operation of an output signal of the first NAND gate and an output signal of the second NAND gate when the non-inverted pulse signal is logic high.

12. The flip flop of claim 11, wherein the third NAND gate is a tri-state NAND gate.

13. The flip flop of claim 11, wherein the latch unit includes:
a first node to which is provided a signal derived from the multiplexer;
a first inverter to provide, to a second node, an inverted version of the signal on the first node;

a second inverter to provide, to the first node, an inverted version of the signal on the second node; and a third inverter to provide, to a third node, an inverted version of the signal on the first node; and a signal on the third node representing an output of the latch unit.

14. The flip flop of claim 13, wherein the latch unit further includes:

a switch to selectively transfer, to the first node, the signal derived from the multiplexer.

15. The flip flop of claim 14, wherein the switch includes at least one of:

a tri-state inverter and;
a transmission gate.

16. The flip flop of claim 14, wherein the second inverter is a tri-state inverter.

17. The flip flop of claim 14, wherein the latch unit further includes:

a fourth inverter to provide, to a fourth node, an inverted version of a signal output by the multiplexer;

wherein the derived signal is a signal on the fourth node.

18. The flip flop of claim 1, wherein when one of the data signal and the scan input signal is transferred to the node according to the activation of one of the inverted pulse signal and the non-inverted pulse signal, the transferred data signal or scan input signal is latched according to a following activation of the other of the inverted pulse signal and the non-inverted pulse signal being activated for transferring one of the data signal and the scan input signal.

19. A pulse-based flip flop which outputs a scan input signal and a data signal, the flip-flop comprising:

a pulse generator to generate a pulse signal for coordinating operation of the flip flop, the pulse signal includes only a non-inverted pulse signal and an inverted pulse signal;

a multiplexer to receive the data signal, the scan input signal, and a scan enable signal, and to selectively output one of the data signal and the scan input signal in response to the scan enable signal;

a latch unit to transfer therethrough the data signal or the scan input signal received from the multiplexer according to the non-inverted pulse signal and the inverted pulse signal; wherein, the pulse generator comprises:

a first PMOS transistor to connect a second node to a supply voltage, in response to a voltage of a first node to which a clock signal is input;

a first NMOS transistor to connect the second node with a third node in response to a voltage of the first node;

a second PMOS transistor to connect a fourth node to the supply voltage in response to the voltage of the first node;

a second NMOS transistor to connect the fourth node with a fifth node in response to the voltage of the first node;

a third NMOS transistor to connect the third node to a ground voltage in response to a voltage of the fourth node;

a third PMOS transistor to connect a sixth node to the supply voltage in response to the voltage of the fourth node;

a fourth PMOS transistor to connect the sixth node with the second node in response to the voltage of the fourth node;

a first inverter to invert and output a voltage of the second node to a seventh node;

a fourth NMOS transistor to connect the fourth node with an eighth node in response to a voltage of the seventh node;

a fifth NMOS transistor to connect the eighth node to the ground voltage in response to the voltage of the seventh node;

a second inverter to invert and output the voltage of the fourth node to a ninth node; and a sixth NMOS transistor to connect the fifth node to the ground voltage in response to a voltage of the ninth node, wherein an output of the seventh node is the non-inverted pulse signal and an output of the second node is the inverted pulse signal.

20. A pulse-based flip flop for selectively outputting one of a scan input signal and a data signal, comprising:

pulse generation means for generating a pulse signal to coordinate operation of the flip flop, the pulse signal includes only a non-inverted pulse signal and an inverted pulse signal;

multiplexer means, operable upon the data signal, the scan input signal, and a scan enable signal, for selectively outputting one of the data signal and the scan input signal in response to the scan enable signal, wherein the multiplexer means performs the operation of selective outputting irrespective of the non-inverted pulse signal and the inverted pulse signal; and latch means for transferring therethrough the data signal or the scan input signal received from the multiplexer means according to the non-inverted pulse signal and the inverted pulse signal, wherein the latch means latches the data signal or the scan input signal received from the multiplexer through a common latching path wherein the latch means includes:

a switching circuit connected between the multiplexer means and a node, the switching circuit being arranged to selectively transfer one of the data signal and the scan input signal received from the multiplexer means to the node according to an activation of one of the inverted pulse signal and the non-inverted pulse signal:

an output circuit connected to the node; and a voltage maintenance type of circuit loop connected to the node, the voltage maintenance type of circuit loop being arranged to selectively maintain a voltage at the node according to an activation of the other of the one of the inverted pulse signal and the non-inverted pulse signal being activated for selectively transferring one of the data signal and the scan input signal.

21. The flip flop of claim 20, wherein when one of the data signal and the scan input signal is transferred to the node according to the activation of one of the inverted pulse signal and the non-inverted pulse signal, the transferred data signal or scan input signal is latched according to a following activation of the other of the inverted pulse signal and the non-inverted pulse signal being activated for transferring one of the data signal and the scan input signal.

22. A pulse-based flip flop which outputs a scan input signal and a data signal, the flop-flop comprising:

a pulse generator to generate a pulse signal for coordinating operation of the flip flop, the pulse signal includes only a non-inverted pulse signal and an inverted pulse signal;

a multiplexer to receive the data signal, the scan input signal, and a scan enable signal, and to selectively output one of the data signal and the scan input signal in response to the scan enable signal, wherein the multiplexer performs the operation of selective outputting irrespective of the non-inverted pulse signal and the inverted pulse signal;

a switching circuit, an output thereof being connected to a first node, an input thereof being provided with a signal to be passed through the flip flop, the switching circuit being connected between the multiplexer and the first node, the switching circuit being arranged to selectively transfer one of the data signal and the scan input signal received from the multiplexer to the first node according to an activation of one of the inverted pulse signal and the non-inverted pulse signal;

an output circuit, connected to the first node, to provide an output of the flip flop on a second node; and a voltage maintenance type of circuit loop connected to the first node, wherein the a latch unit latches the data signal or the scan input signal through a common latching path, the voltage maintenance type of circuit loop being arranged to selectively maintain a voltage at the first node according to an activation of the other of the one of the inverted pulse signal and the non-inverted pulse signal being activated for selectively transferring one of the data signal and the scan input signal.

23. The flip-flop of claim 22, wherein voltage maintenance circuit loop includes at least one of the following:

an inverter to which is input a signal output by the switching circuit;

a NAND gate to which is input a signal output by the switching circuit and an inverted version of a set signal such that an output of the latch unit can be set according to the inverted set signal; and a NOR gate to which is input a signal output by the switching circuit and a reset signal such that an output of the latch unit can be set according to reset signal.

24. The flip flop of claim 22, wherein the latch unit includes:

a first inverter to provide, to a third node, an inverted version of the signal on the first node, and a second inverter to provide, to the first node, an inverted version of the signal on the second node, the second inverter being a tri-state inverter; and the output circuit includes a third inverter to provide, to the second node, an inverted version of the signal on the first node.

25. The flip flop of claim 22, wherein the switching circuit includes at least one of:

a tri-state inverter; and a transmission gate.

26. The flip flop of claim 22, wherein when one of the data signal and the scan input signal is transferred to the first node according to the activation of one of the inverted pulse signal and the non-inverted pulse signal, the transferred data signal or scan input signal is latched according to a following activation of the other of the inverted pulse signal and the non-inverted pulse signal being activated for transferring one of the data signal and the scan input signal.

* * * * *